July 16, 1963 W. S. WINFIELD ET AL 3,098,208
COUPLING CIRCUIT FOR CONNECTING TOGETHER TWO RESONANT CIRCUITS
AND TUNING THE WHOLE OVER A BAND OF FREQUENCIES
Filed Sept. 29, 1958 2 Sheets-Sheet 1

INVENTORS:
WILLIAM S. WINFIELD,
ROBERT A. MUSCHAMP,
BY Donald N. Timbie
THEIR ATTORNEY.

INVENTORS:
WILLIAM S. WINFIELD,
ROBERT A. MUSCHAMP,
BY Donald N. Timbie
THEIR ATTORNEY.

3,098,208

COUPLING CIRCUIT FOR CONNECTING TOGETHER TWO RESONANT CIRCUITS AND TUNING THE WHOLE OVER A BAND OF FREQUENCIES

William S. Winfield, Kirkville, and Robert A. Muschamp, North Syracuse, N.Y., assignors to General Electric Company, a corporation of New York Filed Sept. 29, 1958, Ser. No. 764,192
7 Claims. (Cl. 334—64)

Figure 1:
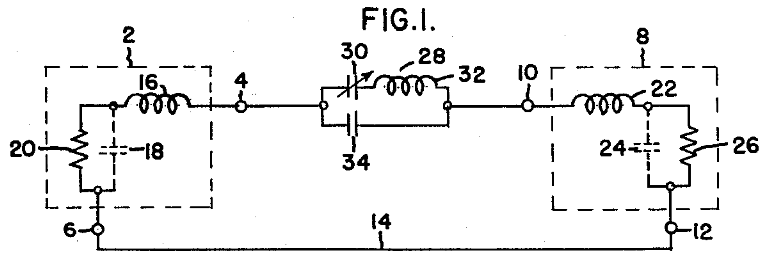

This invention relates to a circuit for tunably coupling two devices for any desired signal frequency within a band of frequencies including the frequency at which the output circuit of one device and the input circuit of the other are resonant. The circuit is also useful in tuning an input circuit or an output circuit that is series resonant within the desired frequency band.

It is well known that coupling two devices can best be performed if the tunable coupling circuit is such as to make the loop formed by itself and the respective input and output circuits of the devices resonant at the desired signal frequency. In order to achieve this result, the coupling circuit must introduce inductance into the loop in tuning to signal frequencies on one side the frequency at which the combined output and input circuits are resonant, and it must insert capacitance into the loop in tuning to signal frequencies on the other side. Where an input or an output circuit is being tuned, inductance or capacitance is connected in series with it.

Various means have been used to produce the desired loop resonance. Switches have been employed to insert a variable inductor or capacitor in the loop as required. In addition to the expense and the fact that the reactance of the switches presents difficult design problems it is difficult to provide an inductance that varies from a value sufficient to produce loop resonance at the lowest frequencies to a value of practically zero at the resonant frequency of the rest of the loop. It is equally difficult to provide a capacitance that varies from a value small enough to produce loop resonance at the highest frequencies to an extremely large value, theoretically infinity, at the resonant frequency of the rest of the loop. The small value of the inductance and the large value of the capacitance at the resonant frequency of the rest of the loop are required in order that the inductance or capacitance, as the case may be, will have zero reactance. Otherwise the loop can never be resonant at the resonant frequency of the input and output circuits.

Accordingly, it is an object of this invention to provide a tuned coupling circuit in which practicable electrical components can be used.

Another disadvantage of switches is the fact that they do not produce a smooth transition in tuning from frequencies on one side of the resonance frequency of the remainder of the loop to frequencies on the other side. A simple series circuit comprised of an inductor and a capacitor, one of which is variable, could be used to provide a smooth transition but analysis shows that the inductance and capacitance cannot be provided by practicable inductors and capacitors.

It is therefore another object of the invention to provide an improved coupling circuit having practicable components that are capable of smoothly tuning through the resonance frequency of the devices being coupled.

It is possible to couple two devices with a tunable transmission line and obtain resonance by varying the effective length of the line, but this generally involves the use of sliding contacts with their attendant problems. In addition, the lines are expensive and occupy considerable space.

In addition to the foregoing objects, it is another object of this invention to provide a small inexpensive tunable coupling circuit that avoids the use of sliding contacts.

Briefly, these objectives may be attained in accordance with this invention by inserting in the loop to be tuned a series circuit comprised of an inductance and a capacitance, one of which is variable, and by connecting a predetermined capacitance in parallel with the series circuit.

Figures 2, 3:
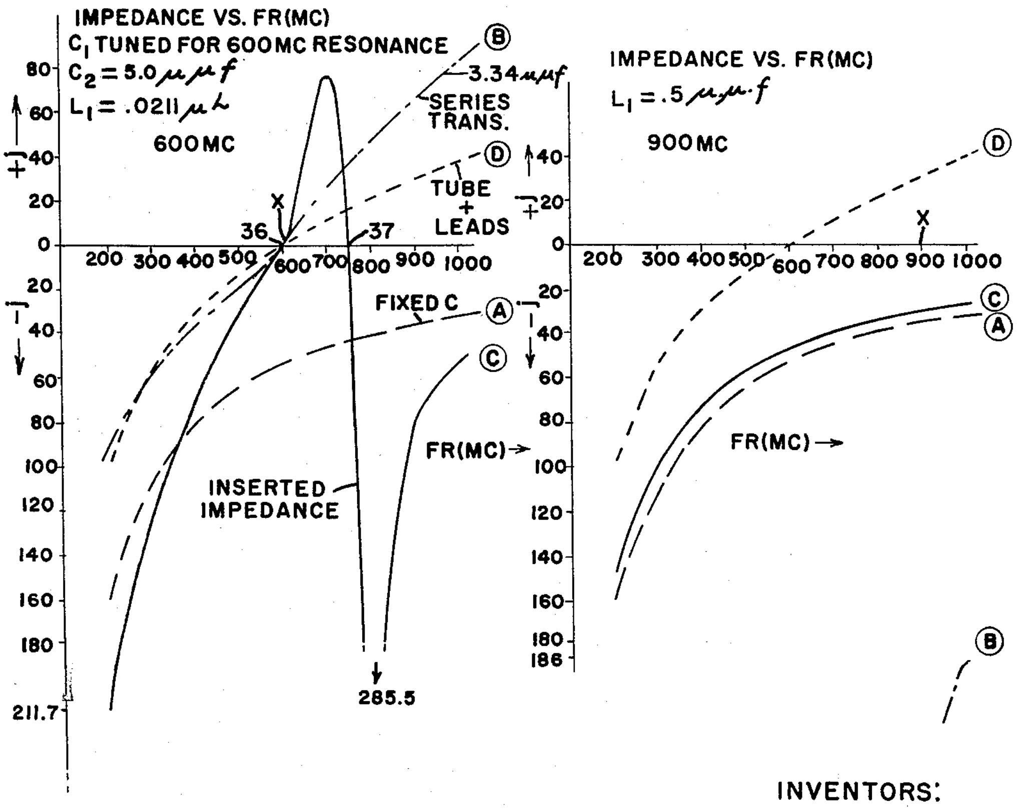
Figure 4:
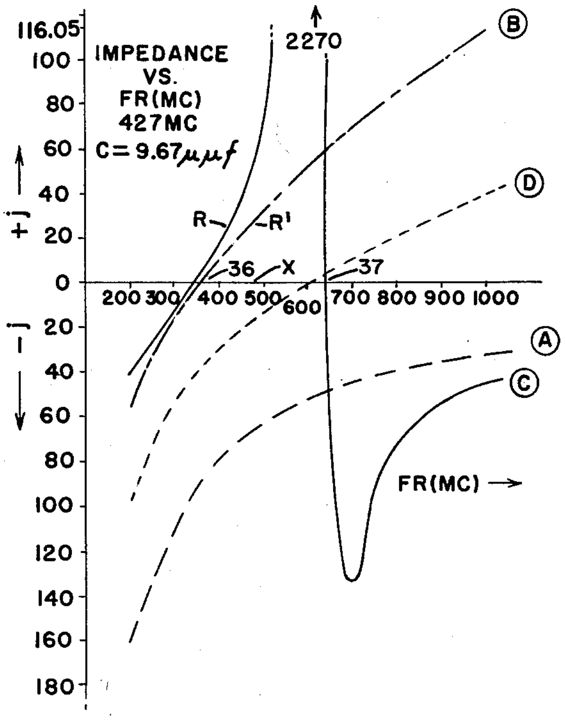
Figure 5:
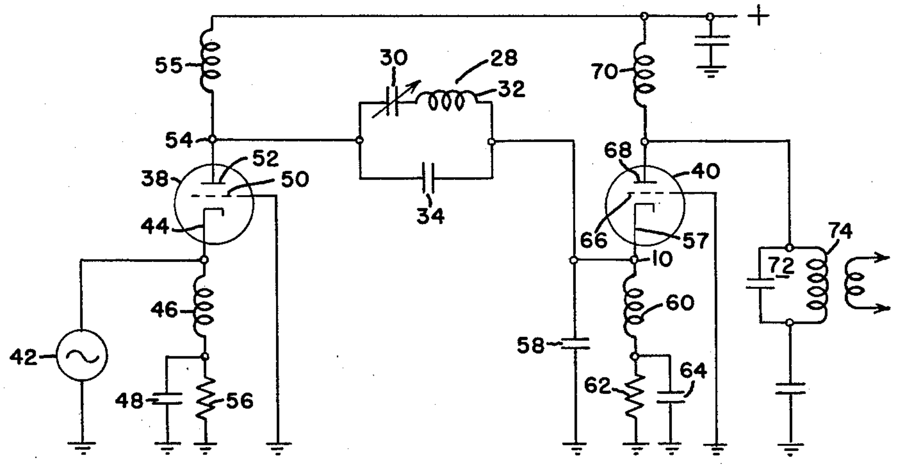

The features of the invention which are believed to be novel are set forth with particularity in the appended claims. The organization and manner of operation of the invention, together with further objects and advantages thereof, may best be understood by reference to the following description taken in conjunction with the accompanying drawings, in which like reference numerals refer to like elements in all figures, and in which:

FIGURE 1 is a schematic representation of the manner in which the circuit of this invention may be use to couple any two devices;

FIGURE 2 is a graphic representation of the various impedances of the loop as a function of frequency when the coupling circuit is adjusted so as to introduce zero reactance in the loop and hence permit the loop to resonate at the same frequency as the resonant frequency as the rest of the loop; and FIGURE 3 is a graphic representation of the various impedances of the loop as a function of frequency when the coupling circuit is adjusted so as to tune the loop for resonance at a high frequency; and FIGURE 4 is a graphic representation of the various impedances of the loop as a function of frequency when the coupling circuit is adjusted so as to tune the loop for resonance at a low frequency; and FIGURE 5 is a schematic representation of the circuit of this invention as it might be used for coupling two grounded grid amplifiers.

For a better understanding of this invention, detailed reference is now made to the drawings. In FIGURE 1 a source 2 is provided with output terminals 4 and 6 and a device 8 is provided with input terminals 10 and 12. Normally the terminals 6 and 12 are connected to a fixed potential such as ground and the line 14 may be any suitable ground return path such as may be provided by a metal chassis. The internal impedance of the device 2 between the terminals 4 and 6 may be comprised of an inductance 16 connected in series with a capacitance 18, either inherent as shown or actual, and a resistance 20 that is in parallel with the capacitance 18. The resistance 20 may not be an actual resistor but may be an effective resistance in the output circuit. Whether or not these internal elements constituting the inter-terminal impedance are actually or effectively connected as shown makes no difference, as there will usually be some signal frequency at which they are series resonant. In some cases, where the resistance 20 is too small, no resonance will be possible, but this is not generally the case for most output circuits. It should be understood that the device 2 may include other impedance elements but that only those affecting the impedance between the output terminals 4 and 6 for signal frequencies are shown in equivalent circuit form.

The internal impedance between the input terminals 10 and 12 of the device 8 is similarly shown as being comprised of an inductance 22 connected in series with a capacitance 24, either inherent or actual, and a resistance 26 that is shown as being connected in parallel with the capacitance 24. Once again the resistance may be an actual resistor or merely an effective resistance. Only those impedances within the device 2 that affect the internal impedance for signal frequencies between the input terminals 10 and 12 are shown in equivalent circuit form. It is apparent that unless the resistance 26 is too low, the circuit between the terminals 10 and 12 will be resonant at some signal frequency. Of course, this frequency may be different from that at which the internal impedance of the device 2 is resonant.

In either of the devices 2 or 8, it is to be understood that the elements making up the respective inter-terminal impedance are merely representative and that other configurations, including additional impedance elements, that are capable of exhibiting series resonance may actually exist in a given case.

The portion of the circuit thus far described is broadly representative of any that may be encountered to which the invention is applicable. In accordance with this invention, the loop formed by the internal impedance between the output terminals 4 and 6, the ground return path 14 and the internal imepdance between the terminals 12 and 10 is completed by a coupling means 28 shown as being comprised of a variable tuning capacitor 30 and an inductance 32 connected in series between the terminals 4 and 10 and a capacitor 34 connected in parallel with the capacitor 30 and the inductance 32.

The value of the inductance 32 is such that it series resonates with the variable capacitor 30 at the resonant frequency of the rest of the loop when the capacitor 30 is at an intermediate setting. Under this condition the series branch 30, 32 has extremely low resistance and effectively short circuits the capacitor 34. The loop is then tuned to the same frequency as if the coupling network 28 were not present and the terminals 4 and 10 were directly connected.

In order to tune the loop to resonance for higher frequencies the capacitance of the capacitor 30 is decreased, and in order to tune the loop to resonance for lower frequencies the capacitance of the capacitor 30 is increased. This action can better be understood by examination of the graphs of FIGURES 2, 3 and 4. The graphs are representative of an actual situation inasmuch as they are based on calculation using the parameters of an actual circuit. The dash lines A represent the reactance of the capacitor 34, the dash dot lines B represent the reactance of the series branch comprised of the variable capacitor 30 and the inductance 32, and the solid lines C represent the reactance presented by the entire tuning circuit between the terminals 4 and 10. The dotted lines D represent the reactance of the rest of the loop between the terminals 4 and 10 and includes, of course, the reactance of the devices 2 and 8 as well as of the ground lead 14. The points X indicate those frequencies at which the entire loop is tuned to resonance and hence the signal frequency that is selected.

The graph of FIGURE 2 illustrates the various reactances for the condition when the capacitor 30 is at an intermediate value and the inductance 32 is such as to series resonate with the capacitor 30 at the same frequency as the rest of the loop. The signal frequency to which the system is tuned is indicated at X (600 megacycles) where the curves B and D cross the axis. The curve C, representing the reactance of the capacitors 30, 34 and the inductance 32, also crosses the axis at point X because the series branch 30, 32 is resonant and therefore has zero reactance.

At frequencies above 600 megacycles the series branch 30, 32 (curve B) of the coupling circuit becomes increasingly inductive, and at 750 megacycles has an inductive reactance that is equal to the capacitive reactance of the capacitor 34 so as to produce a condition of parallel resonance. At a slightly higher frequency (760 megacycles in this illustration) the coupling circuit 30, 32, 34 has a capacitive reactance that is equal to the inductive reactance (curve D) of the rest of the loop so that the loop is again series resonant. It might appear that the circuit would couple signals of 760 megacycles equally as well as signals of 600 megacycles, but such is not the case because at 760 megacycles, the impedance of the coupling circuit 30, 32, 34 has a high resistive component that lowers the Q of the loop to such an extent as to severely attenuate frequencies in the vicinity of 760 megacycles.

The graph of FIGURE 3 illustrates the various reactances when the capacitance of the capacitor 30 is reduced so as to tune the loop for resonance at 900 megacycles. This increases the resonance frequency of this capacitor and the inductance 32 by such a great amount that the curve B crosses the zero reactance axis at a frequency that cannot be readily shown on the graph. Only a section of the curve B is shown. The reactance curve C representing the reactance of the coupling circuit 30, 32, 34 also crosses at this point because the series branch 30, 32 is in shunt with the capacitor 34 and when it has zero reactance it short circuits the capacitor 30. Because the curve A (the reactance of the capacitor 30) and the curve B (the reactance of the series branch 30, 32) represent reactances connected in parallel, the resultant reactance, curve C, is always lower than the curve A except for frequencies at which the series branch 30, 32 becomes inductive and approaches parallel resonance with the capacitor 34. This condition is not shown as it is at such a high frequency. (Signals of such high frequencies would be attenuated by the low Q of the loop as previously explained as well as by other portions of the circuit.) The point X indicating the selected signal frequency at which the entire loop is resonant occurs at a point higher than before, 900 megacycles in this illustration, where the inductive reactance of the curve D is equal to the capacitive reactance of the curve C.

The graph of FIGURE 4 illustrates the various reactances when the capacitance of the capacitor 30 is increased so as to make the inductive reactance of the coupling circuit 30, 32, 34 (curve C) equal to the capacitive reactance (curve D) of the rest of the loop at a frequency of approximately 427 megacycles. Parallel resonance of the coupling circuit occurs at about 640 megacycles but the resistive component of the impedance is so high and the Q of the loop consequently so low that signals in the vicinity of this frequency are severely attenuated.

It might at first appear that the same tuning range could be effected by use of a series circuit comprised of a variable capacitor and a fixed inductor i.e. by eliminating the capacitor 34 from the circuit of FIGURE 1. If this were done the series circuit would be series resonant at the same frequency as the rest of the loop, 600 megacycles in the illustration example. In tuning to higher frequencies, the capacitance of the capacitor 30 would be reduced and its reactance thereby increased. This means that more and more of the available voltage appears across the capacitor 30 and less across the capacitance 24. This is important because the voltage across the capacitance 24 is usually the input voltage for the device 8. Furthermore, the effective capacitive reactance inserted on the loop is the capacitance reactance of the capacitor 30 less the reactance of the inductor 32 and hence to obtain a given capacitive reactance, the capacitance of the capacitor 30 must be reduced much more than if the inductor 32 were not present. In order to offset this, a separate inductor having less inductance would be substituted for the inductor 32. In a turret type tuner this means that another circuit strip must be used. In tuning to lower frequencies the capacitance of the capacitor 30 is increased. However, it is difficult, as a practical matter to provide a capacitor that will cover the range of capacitance values required and an inductor having a larger inductance would be inserted in place of the inductor 32. Once again this requires an additional strip in a turret type tuner.

Theoretically this could be overcome if the capacitor were fixed and the inductor made variable. However, practicable inductors have at high frequencies a significant minimum value, and in order that the series branch have enough capacitive reactance to tune the loop to resonance at high frequencies, the value of the capacitor would have to be extremely low. This results in an extremely high reactance across which too much of the voltage of the loop would appear. Once again this difficulty could be overcome by using a shunt capacitor.

The use of the capacitor 34 overcomes these difficulties in the following manner. As the capacitance of the capacitor 30 is reduced, in tuning to higher frequencies, its reactance increases as before, but more and more of this signal current flows through the capacitor 34. Hence the voltage division between the variable capacitor 30 and the input capacity 24 is not so unfavorable as to prevent a reasonable portion of the voltage of the loop from appearing across the input capacity 24.

As can be seen from FIGURE 4, the capacitor 34 also aids in tuning to lower frequencies. With a series circuit having a reactance as represented by curve B, it would be necessary to increase the capacitance of the capacitor 30 so as to produce the same amount of capacitive reactance at point X. The curve B would then be moved to the left by an amount equal to the distance between the points R and R'.

In designing a coupling circuit of this invention the capacitor 34 is selected so as to produce resonance with the reactance of the rest of the loop at a frequency at least as high as the highest signal frequency to be coupled. If the capacitance of capacitor 30 can be reduced to zero, capacitor 30 could be of such size to produce loop resonance at the highest signal frequency to be accommodated because the impedance of the series branch 30, 32 would theoretically be infinite. However, in an actual circuit, capacitor 30 will have some capacitance even at its smallest setting and the series branch 30, 32 will have a high amount of inductive reactance. As a result, the effective capacitance between the terminals 4 and 10 will be somewhat less than that of the capacitor 34 by itself. Hence if the capacitor 34 has exactly the amount of capacitance to produce loop resonance at the highest signal frequency, loop resonance would not be attained. Therefore, the capacitor 34 should have enough more capacity to produce loop resonance when the capacitor 30 is adjusted to have minimum capacitance.

The following relates to certain factors that should be considered in selecting the value of the capacitor 30 and the inductance 32. In the graphs of FIGURES 2 and 4, the series branch 30, 32 is resonant at frequencies indicated by the numeral 36 and the coupling circuit 30, 32 and 34 is parallel resonant at frequencies indicated by the numeral 37. In the graph of FIGURE 3, these points are not shown. The ratio between these frequencies, as the capacitance of the capacitor 30 is varied, is in accordance with the relation $$\frac{XC_{30}+XC_{34}}{XC_{30}}$$

Hence, as the capacitor 30 is reduced, the ratio decreases and vice versa. In tuning to higher frequencies, the ratio referred to is not critical, but in tuning to the lower frequencies, the following considerations are of importance. In general, the smaller the ratio, the closer is the frequency of the tuned signal to the frequency of parallel resonance. Although the resistance component of the impedance of the coupling circuit 28 is not shown in the graphs, it is well known that it increases as parallel resonance is approached. Therefore, if the loop resonance for a particular signal frequency is attained at a frequency too close to that of parallel resonance, the Q of the loop will be lowered, thus reducing signal output and tending to increase the bandwidth of the coupling circuit.

On the other hand, when parallel resonance is approached, a given change in the capacitance of the variable capacitor 30 causes an increasingly greater change in inductive reactance and hence increases the effective tuning range for a capacitor with a given range. For example, if the shunt capacitor 34 were removed from the circuit, the reactance inserted in the loop would be that of the seires branch alone as indicated by the curves B. Examination of curve B of FIGURE 4 shows that it has a lower slope in the region of inductive reactance than the curve C and that its frequency of series resonance would have to be lowered below the point shown in order to provide the same inductive reactance as the curve C at the desired signal frequency X. This means that the range of the capacitor 30 would have to be increased.

In FIGURE 5 the coupling circuit 28 of this invention is used to tunably couple two grounded grid triode amplifiers 38 and 40. A signal source 42 is coupled to the cathode 44 of the amplifier 38. An inductance 46 provides the necessary impedance for signal frequencies, and the parallel capacitor 48 and resistor 50 furnish the required bias. The grid 50 is grounded. The anode 52 is connected to the terminal 4 which is connected to B+ via a load inductor 55. The coupling circuit 28 is connected between the terminal 4 and the terminal 10. An inductor 60 provides an impedance for signal frequencies, and combination of a resistor 62 and a capacitor 64 supplies the required bias. A grid 66 is grounded, and an anode 68 is connected to B+ via another load inductor 70. Output signals may be derived from the anode 68 in any desired manner, e.g., by a parallel resonant circuit 72 having in one branch thereof a primary 74 of an output transformer. In the particular circuit shown a capacitor 58 is connected between the cathode 57 and ground for impedance matching purposes. If included this capacitor forms part of the loop. As is well known to those skilled in the art, an inherent capacitance, corresponding to 18 of FIGURE 1, exists between the anode 52 and ground and another inherent capacitance, corresponding to 24 of FIGURE 1 between the cathode 57 and the grounded grid 66. Now if the loop of which these capacitances form a part is resonant, the signal voltage across them is greatly enhanced.

If it is desired to tune the impedance existing between two terminals through a frequency at which the impedance is series resonant, the circuit 30, 28, 34 would be connected between the terminals.

It should be understood that this invention may be used in connection with any type of device, whether it be a vacuum tube, a transistor or some other type, as long as the output circuit of one device and/or the input circuit of the other exhibit series resonance within the desired tuning range.

While the present invention is described by reference to a particular embodiment thereof, it will be understood that numerous modifications may be made by those skilled in the art without actually departing from the invention. We therefore, aim in the appended claims to cover all such variations as come within the true spirit and scope of the foregoing disclosure.

What we claim as new and desire to secure by Letters Patent of the United States is:

1. A circuit for tuning over a wide range of frequencies comprising in combination, a first device having a pair of output terminals, a second device having a pair of input terminals, there being effectively between each pair of terminals a capacitance and inductance connected in series which in combination are series resonant at a predetermined frequency within the desired frequency range, a connection between one terminal of said first pair and one terminal of said second pair, a coupling circuit connected between the remaining terminals of each pair so as to complete a loop, said coupling circuit being comprised of a series branch having a capacitor and an inductor and a capacitor connected in shunt with said series branch, the values of the components of said latter coupling circuit being such as to cause the entire loop to be resonant at any frequency to which the circuit is to be tuned within the range.

2. A circuit for tuning over a wide range of frequencies comprising in combination, a first device having a pair of output terminals, a second device having a pair of input terminals, there being effectively between each pair of terminals a capacitance and inductance connected in series which in combination are series resonant at a predetermined frequency within the desired frequency range, a connection between one terminal of one pair and one terminal of the second pair, a coupling circuit connected between the remaining terminals of each pair so as to complete a loop, said coupling circuit being comprised of a series branch having a first capacitor and an inductor, one of which is variable, and a second capacitor connected in shunt with said series branch one of said first capacitor and said inductor of said series branch being variable and having an intermediate value such that the resonance of said series branch occurs at said predetermined frequency, said second capacitor having a value such as to produce series resonance with the capacitance and inductance between both said terminals at a frequency above said predetermined frequency.

3. A tunable circuit for coupling one device to another for a selected frequency within a desired wide range of frequencies comprising a first device having an output circuit, a second device having an input circuit, said output and input circuits together being such as to exhibit series resonance at some predetermined frequency within the desired range of frequencies, a coupling circuit connected between one side of said output circuit to one side of said input circuit, and a coupling circuit for completing the loop connected between the other side of said output circuit and the other side of said input circuit, said latter coupling circuit being comprised of a series circuit having an inductor and a first capacitor one of which is variable and a second capacitor connected in shunt with said series circuit one of said first capacitor and said inductor of said series branch being variable and having an intermediate value such that the resonance of said series branch occurs at said predetermined frequency, said second capacitor having a value such as to produce series resonance with the capacitance and inductance between both said terminals at a frequency above said predetermined frequency.

4. A circuit for tuning over a wide range of frequencies comprising in combination, a first device having a pair of output terminals, a second device having a pair of input terminals, there being effectively between each pair of terminals a capacitance and inductance connected in series which in combination are series resonant at a predetermined frequency within the desired frequency range, a connection between one terminal of said first pair and one terminal of said second pair, a coupling circuit connected between the remaining terminals of each pair so as to complete a loop, said coupling circuit being comprised of a series branch having a capacitor and an inductor and a capacitor connected in shunt with said series branch, the values of the said capacitor and inductor of said series branch being such as to produce series resonance of said loop at a frequency to which tuning is desired.

5. A circuit for tuning over a wide range of frequencies comprising in combination, a first device having a pair of output terminals, a second device having a pair of input terminals, there being effectively between each pair of terminals a capacitance and inductance connected in series which in combination are series resonant at a predetermined frequency within the desired frequency range, a connection between one terminal of one pair and one terminal of the second pair, a coupling circuit connected between the remaining terminals of each pair so as to complete a loop, said coupling circuit being comprised of a series branch having a capacitor and an inductor, one of which is variable, and a capacitor connected in shunt with said series branch, the values of said capacitor and inductor of said series branch being such as to produce series resonance at said predetermined frequency.

6. A circuit comprising a first electron discharge device having first and second output terminals, a second electron discharge device having first and second input terminals, means for coupling said first output terminal to said first input terminal, the impedances between said first and second output terminals and said first and second input terminals being such that in combination with the impedance of said coupling means series resonance occurs at a predetermined frequency within a range of frequencies for which the circuit is to be operative, a coupling circuit coupled between said second output terminal and said second input terminal comprised of an inductor and a first capacitor connected in series and a second capacitor connected in shunt with said inductor and first capacitor, said inductor and said first capacitor being capable of exhibiting series resonance at said predetermined frequency.

7. Apparatus for selecting and transferring signals occurring within a wide range of signal frequencies from the output terminals of a first device to the input terminals of a second device wherein the impedances between said output and input terminals exhibit, when connected in series, a series resonance at a predetermined frequency within the wide range of signal frequencies comprising means for connecting one of said output terminals to one of said input terminals, a coupling circuit connected between the other output terminal and the other input terminal so as to form a loop, said coupling circuit being comprised of a first capacitor and an inductor connected in series between said other output and input terminals and a second capacitor connected in series between said other output and input terminals, and means for rendering the impedance of said coupling circuit substantially resistive when a signal to be selected and transferred is of the predetermined frequency, sufficiently inductive to cause said loop to be capable of series resonance at a frequency of the signal to be selected and transferred when the signal frequency is less than the predetermined frequency and sufficiently capacitive to cause said loop to be capable of series resonance at a frequency of a signal to be selected and transferred when the signal frequency is greater than the predetermined frequency.

References Cited in the file of this patent

UNITED STATES PATENTS

| | | |
|---|---|---|
| 1,568,143 | Elsasser | Jan. 5, 1926 |
| 1,597,420 | Austin | Aug. 24, 1926 |
| 1,850,831 | Elliott | Mar. 22, 1932 |
| 2,276,873 | Rambo et al. | Mar. 17, 1942 |
| 2,524,821 | Montgomery | Oct. 10, 1950 |
| 2,661,459 | Schmidt | Dec. 1, 1953 |
| 2,743,356 | Sziklai | Apr. 24, 1956 |
| 2,912,656 | Waring | Nov. 10, 1959 |